United States Patent [19]

Starski

[11] Patent Number: 4,590,660

[45] Date of Patent: May 27, 1986

[54] COMPONENT LEAD PROCESSING DEVICE

[75] Inventor: Wojciech Starski, Lexington, Ky.

[73] Assignee: RCA Corporation, Princeton, N.J.

[21] Appl. No.: 531,242

[22] Filed: Sep. 12, 1983

[51] Int. Cl.[4] ............................................. H05K 3/30
[52] U.S. Cl. .................................. 29/566.3; 29/705;
  29/741; 29/838; 140/105; 227/1; 227/79
[58] Field of Search .................. 29/33 M, 566.3, 705,
  29/741, 739, 720, 566.1, 566.2, 564.8, 753, 837,
  838, 833; 140/105; 227/1, 7, 79

[56] References Cited

U.S. PATENT DOCUMENTS

| | | | |
|---|---|---|---|
| 3,200,481 | 8/1965 | Lenders | 29/203 |
| 3,488,672 | 1/1970 | Martyn | 29/626 |
| 4,215,469 | 8/1980 | Asai et al. | 29/835 |
| 4,286,379 | 9/1981 | Kawa et al. | 29/705 |
| 4,377,026 | 3/1983 | Whitley | 29/564.1 |
| 4,499,649 | 2/1985 | Maxner | 29/566.3 |

Primary Examiner—Z. R. Bilinsky
Attorney, Agent, or Firm—Joseph S. Tripoli; George E. Haas; William Squire

[57] ABSTRACT

A piston body in a housing has first and second opposite facing pistons and a component lead processing member attached to the body between the pistons and movable with the piston body. A stationary lead processing member in sliding engagement with the movable lead processing member receives the lead to be processed. A lead processing controller includes a light sensor and a light emitting device for sensing the presence of a received lead to be processed and for causing air pressure to be selectively supplied to the pistons for processing the lead.

12 Claims, 8 Drawing Figures

COMPONENT LEAD PROCESSING DEVICE

The present invention relates to component lead processing devices, and more particularly, to devices which cut and bend component leads to secure a component to a printed circuit board.

Of interest are the following copending applications: Ser. No. 363,960, filed Mar. 31, 1982, entitled "Multiple Component Lead Processing Apparatus," by George J. Whitley et al.; Ser. No. 302,294, filed Sept. 14, 1981, entitled "Component Lead Processing Device," by George J. Whitley et al.; Ser. No. 455,992, filed Jan. 6, 1983, entitled "Apparatus for Securing a Component to a Printed Circuit Board," by George J. Whitley; Ser. No. 469,722, filed Feb. 25, 1983, entitled "Bending Device," by Frederick W. Kopitzke, III et al.; Ser. No. 469,737, filed Feb. 25, 1983, entitled "Component Lead Bending Apparatus," by George J. Whitley et al.; and Ser. No. 484,258, filed Apr. 12, 1983, entitled "Apparatus for Detecting the Presence of Components on a Printed Circuit Board," by George J. Whitley. All of the above applications are assigned to the assignee of the present invention.

As known, a printed circuit board includes numerous closely-spaced lead receiving apertures. Components may be automatically or manually assembled to the circuit board (which may be on a conveyor) by inserting component leads through the corresponding circuit board apertures. Later in the process it is required that the undersurface of the board pass over a wave soldering machine or the like which solders the protruding component leads to printed circuit board conductors. However, there is a time interval between the time that component leads are inserted into the circuit board apertures and the time the circuit board passes through the soldering apparatus. During this time interval it is possible for the components to disengage from the circuit board.

Another problem is that components of different types, for example, transistors, capacitors, resistors, and even some of the same type, may have leads of different lengths. The leads are required to contact only certain conductors on a printed circuit board. If the leads are too long they may contact conductors which may interfere with the circuit operation. The leads, therefore, should be trimmed before soldering.

Also, it is required that the leads be trimmed to a reasonable length where they protrude from the printed circuit board undersurface to facilitate soldering the leads to the circuit board. Further, to prevent the components from becoming disengaged from the circuit board, it is desired that the protruding leads, after trimming, be crimped or bent over against the circuit board undersurface to preclude the leads from falling out of their corresponding apertures.

Various devices have been employed to perform the lead processing steps such as trimming and bending. However, printed circuit boards tend to become relatively crowded with components which are closely spaced on the board. It is therefore desirable to cut and bend the protruding leads in as compact a process as possible. One example of a system dealing with this problem is disclosed in U.S. Pat. No. 4,377,026. Other lead processing mechanisms are disclosed in several of the above-mentioned copending applications and in U.S. Pat. Nos. 2,827,634; 3,167,779; 3,414,024; 3,574,934; 3,732,898; 4,051,593; 4,054,988; 4,153,082; and 4,165,557, among others.

A component lead processing device in accordance with the present invention includes a housing having a cavity. A piston body in the cavity reciprocates in first and second directions. The piston body includes first and second aligned pistons each in sliding sealed engagement with the cavity walls at opposite respective piston body ends. A lead processing member is attached to the piston body between the first and second pistons and includes means for receiving the lead and for processing the received lead when the member is moved. Control means responsive to the received lead selectively applies pressurized gas to one and then the other of the pistons to thereby move the piston in each of two opposite directions and thereby move the lead processing member for processing the lead.

In the drawing

Figure 1:
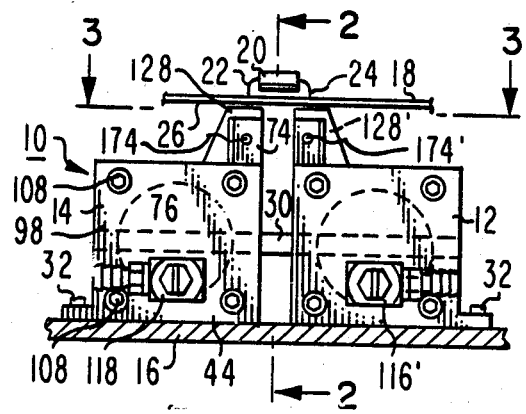
FIG. 1 is an end elevation view of a lead processing device embodying the present invention.

In FIG. 1, component lead processing system 10 includes a pair of like facing component lead processing devices 12 and 14 secured to a support plate 16 by screws 32. System 10 is beneath a conveyorized printed circuit board 18 bearing a component 20 whose leads 22, 24 are to be processed by the devices 14, 12, respectively. The component 20 may be a resistor, a capacitor, a coil, a diode, and so forth, as used in electronic circuits. Component leads 22, 24, when inserted in corresponding apertures in printed circuit board 18, protrude beneath the circuit board 18, undersurface 26.

The printed circuit board 18 is carried by a conveyor system (not shown). One such conveying system is shown in U.S. Pat. No. 4,377,026. Support plate 16 is supported by structure (not shown) located beneath and secured to the conveyor system. The printed circuit board 18 is above the devices 12 and 14. Component 20 leads are inserted into the printed circuit board 18 apertures, manually or by machine, after the conveyor (not shown) has aligned the printed circuit board 18 with the devices 12 and 14.

Such alignment can be achieved by locating pins attached to the support plate 16 which mate with corresponding locating apertures in the printed circuit board 18 (the pins and locating apertures not being shown). Once the printed circuit board 18 is aligned with the devices 12 and 14, the insertion of the component leads into the corresponding printed circuit board apertures inserts the leads into aligned apertures of devices 12 and 14 for processing by the devices 12 and 14. As will be described, the devices 12 and 14 sense the presence of the inserted leads 22 and 24 and process the inserted leads by cutting the lower portions of the extended lead ends protruding beneath the surface 26 of the printed circuit board and by bending the remaining upper portions of the extended lead ends against surface 26.

Figure 3:
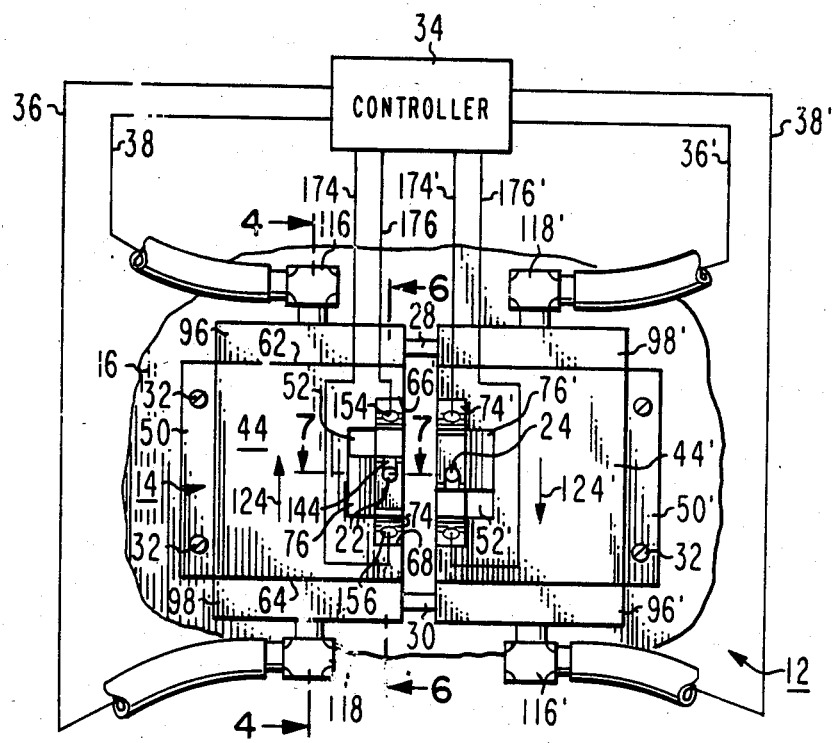
FIG. 3 is a plan view of the embodiment of FIG. 1 further including a diagram of a control system for operating the lead processing device.

In FIG. 3 devices 12 and 14 are mirror images of each other and are mechanically secured in aligned facing relationship by parallel pins 28 and 30. Pins 28 and 30 are secured to respective plates 96, 98' and 98, 96' of devices 14, 12. The primed reference numerals in FIG. 3 refer to identical parts in device 12 having the same unprimed reference numeral in device 14. The pins 28, 30 secure the devices 12 and 14 in a desired spaced relationship to process the leads 22, 24 which may be from the same component such as component 20, FIG. 1. In this case, the devices 12 and 14 are designed to process the leads of a two-lead component such as a resistor or capacitor.

The devices 12 and 14, once secured in the desired spaced relationship by the pins 28 and 30, are secured to the support plate 16 by screws 32. The devices 12 and 14, FIG. 3, are operated by controller 34 which supplies a pressurized gas, e.g., air, over selected one of lines 36, 38 to device 14 and selected one of lines 36', 38' to device 12. Lines 36, 38, 36', and 38', shown schematically, may be air hoses. The devices 12 and 14 include gas operated pistons to be described below which are responsive to the pressurized gas supplied over the lines selected by controller 34.

Figure 5:
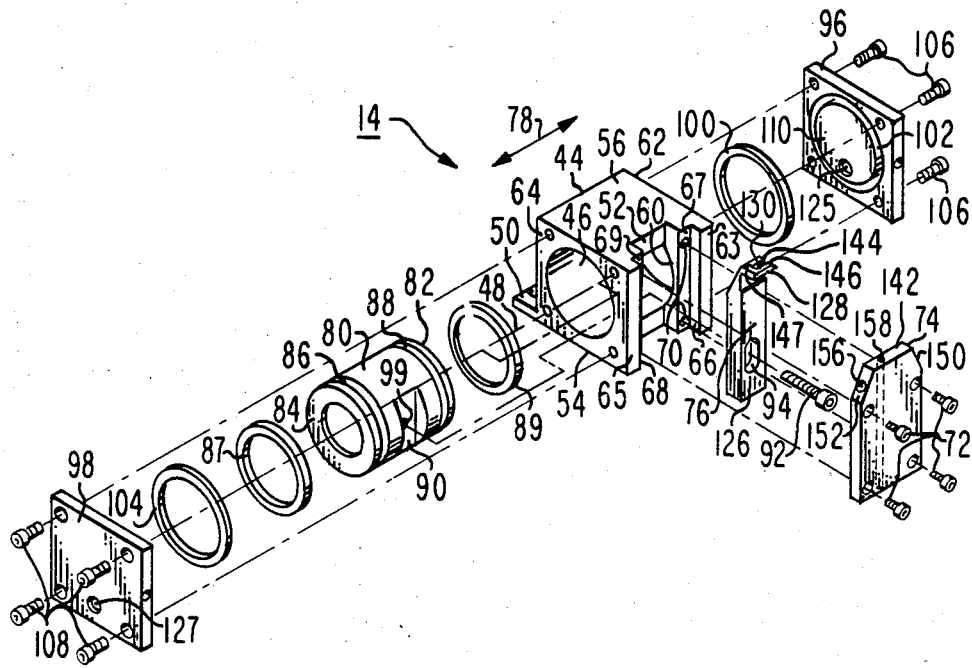
FIG. 5 is an exploded isometric view of a portion of the lead processing device of FIG. 1.

Since the devices 12 and 14 are mirror images of each other, the following description of device 14 is representative. In FIG. 5 device 14 includes a cubical housing 44 having a cylindrical cavity 46 whose longitudinal axis 48 is parallel to directions 78. The housing 44 includes a shoulder 50 having apertures therein for receiving the mounting screws 32, FIG. 3. A slot 52, FIG. 5, extends from the bottom surface 54 to the top surface 56 of the housing 44 normal to directions 78. The slot 52 intersects the cavity 46 forming opening 60 in cavity 46. Slot 52 is about midway between housing 44 end surfaces 62, 64. Two parallel legs 63, 65 extend from housing 44 beyond coplanar surfaces 67, 69 forming facing L-shaped cutouts 66, 68, respectively. Threaded holes 70 (two in surface 67 and two in surface 69), receive screws 72. Screws 72 secure stationary planar blade member 74 to the housing 44 surfaces 67, 69 over opening 60 in cutouts 66, 68. Blade member 74 is thus exterior housing 44.

A movable blade member 76 is in slot 52, over the opening 60 and between the exterior stationary blade member 74 and the housing 44. The slot 52 has a width in directions 78 greater than that of the movable blade member 76 so that the blade member 76 can reciprocate in slot 52 and over opening 60 in directions 78 relative to housing 44.

In FIG. 5, movable blade member 76 comprises an elongated rectangular shank or arm 126 and a blade 128 extending from the upper end of arm 126. Arm 126 has an elongated stepped aperture 94 (FIG. 7), through which screw 92 passes. The head of screw 92 is recessed in aperture 94. Blade 128 lies in a plane generally normal to the length dimension of arm 126 (parallel to directions 78).

Figures 6, 7:
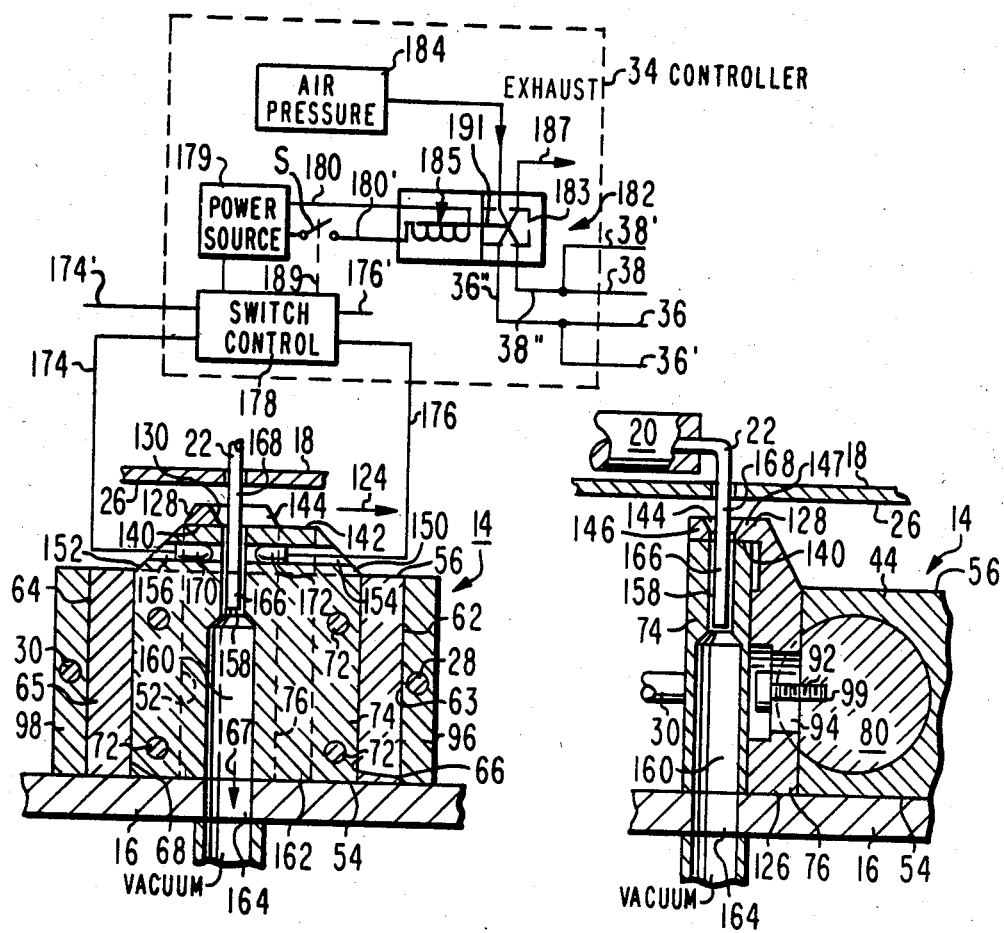
FIG. 6 is an elevation sectional view including a schematic diagram of the control system of the lead processing device of FIG. 3 taken along lines 6—6.
FIG. 7 is an elevation partial sectional view through the lead processing device of FIG. 3 taken along lines 7—7.
Figure 8:
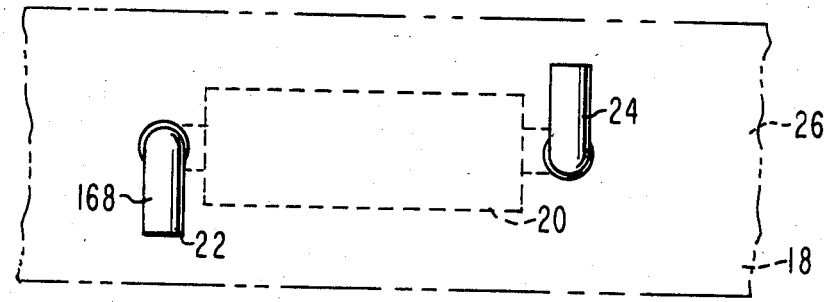
FIG. 8 is a bottom plan view of a printed circuit board showing the appearance of leads processed by the lead processing device of FIG. 1.

In FIG. 7, blade 128 is attached to and depends from the upper end of arm 126 to form an L-shaped element. Blade 128 has a slot 144 having a base wall 130, FIG. 6, and two side walls 146, 147, FIG. 7, for receiving a component lead, e.g., lead 22. Side wall 146 resembles a tine extending parallel to the other side wall 147 attached to arm 126. The wall 146 surface in the slot 144 may be tapered to facilitate entry of a lead into slot 144. The base wall 130 of blade 128, FIG. 6, is tapered to form a cutting edge with the base wall 130 undersurface 140. Base wall 130 has a thickness sufficient to bend the protruding lead portion 168 against the printed circuit board surface 26 when blade 128 is moved in direction 124. The bent portion 168 is shown in FIG. 8. Prior to such bending, the cutting edge riding on stationary blade surface 142 severs the lead lower portion 166 depending below surface 140.

In FIG. 6, the stationary blade member 74 is a plate-like element having an upper planar blade surface 142 in sliding engagement with the overlying undersurface 140 of blade 128. Surface 142 is bounded at opposite sides by two slanted side walls 150 and 152 in which are respective aligned apertures 154 and 156. Surface 142 is also bounded by the broad flat surfaces of member 74, one of which flat surfaces forms an exterior surface of device 14. The exterior surfaces of the members 74, 74' face each other in the assembly of devices 12 and 14 forming system 10 as shown in FIGS. 1 and 3. Thus, the spaced relationship of the respective surfaces 142, 142' of members 74, 74' and blades 128, 128' of devices 14, 12 can be made close, e.g., a small fraction of an inch for processing closely spaced leads. The wall 147 of blade 128 can be made thin to closely space aperture 144 to the exterior edge of member 74 surface 142 for the purpose of processing closely spaced leads (whose spacing is about the same as the spacing of apertures 144, 144'). Apertures 154 and 156 lie on an axis parallel to blade surface 142, directions 78 (FIG. 5) and direction 124.

A light emitting diode 170 is in aperture 156 and a light sensor 172 responsive to the light from diode 170 is in aperture 154. Diode 170 and sensor 172 are, respectively, connected via leads 174, 176, to controller 34 which will be described in more detail below. Leads 174, 176, shown as single leads, each represent a pair of leads. The apertures 154 and 156 are aligned on a common axis transverse to lead receiving aperture 158 in the member 74. The aperture 158 may be slightly larger than the diameter of the lead 22. The light from diode 170 passes transversely through aperture 158 into aperture 156. The component lead 22 in aperture 156 interrupts the diode 170 light patch to sensor 172, causing the sensor 172 output applied to lead 176 to shift in value in a known way. Aperture 158 is in communication with the stationary blade surface 142 and is aligned with slot 144 of blade 128 over surface 142. Aperture 158 is coupled to an enlarged diameter hole 160 in member 74. Hole 160 is in communication with the lower surface 162 of member 74. A hole 164 in support plate 16 is vertically aligned with hole 160. Holes 160 and 164 may be coupled to a vacuum source (not shown) for sucking severed lead portions 166 in direction 167. Such a source may operate, for example, on the Venturi principle.

Upon displacement of the movable blade 128 in direction 124, FIG. 6, lower portion 166 of the lead 22 beneath surface 140 is severed and falls by gravity and a vacuum induced force through the holes 160 and 164. After severing portion 166, blade 128 wall 130 continues to move in direction 124 to bend the remaining upper portion 168 of the lead extending below the surface 26 of the printed circuit board 18 against the printed circuit board as shown in FIG. 8.

A circular cylindrical piston body 80, FIG. 5, is closely received in the cylindrical cavity 46. Body 80 has two pistons 82 and 84 at opposite ends of body 80 aligned on axis 48. The body 80 cylindrical surface hastwo parallel spaced circular grooves 86 and 88 adapted to respectively receive sealing rings 87 and 89. A slot 90 in body 80 between grooves 86 and 88 closely receives the movable blade member 76 arm 126 in the opening 60. Screw 92 in slotted aperture 94 is mated to threaded hole 99 in body 80 securing blade member 76 to body 80 interlocking member 76 and body 80 to housing 44.

Figure 4:
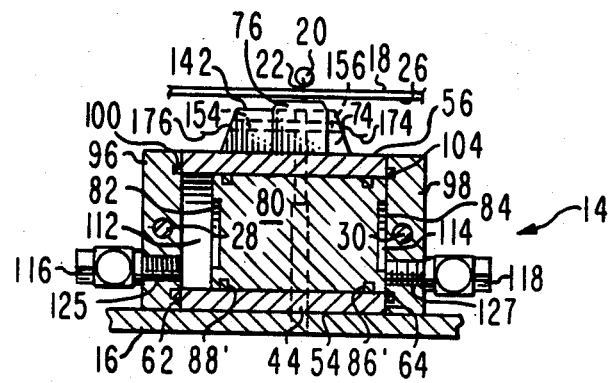
FIG. 4 is an elevation sectional view through the lead processing device of FIG. 3 taken along lines 4—4.

Plates 96 and 98, which may be identical, attached to the respective housing 44 end surfaces 62, 64, form sealed piston chambers 112, 114 with pistons 82, 84, respectively, FIG. 4. A circular sealing ring 100 is received in groove 102 in plate 96, and a similar ring 104 is received in a circular groove (not shown) in plate 98. Ring 100 seals the plate 96 to surface 62 and ring 104 seals the plate 98 to surface 64. Screws 106, 108 attach respective plates 96 and 98 to housing 44. The space between central portion 110 of plate 96, FIG. 5, and piston 82 form the piston chamber 112 and the space between a similar central portion of plate 98 and piston 84 form the second piston chamber 114, FIG. 4. The piston body 80 reciprocates in directions 78, FIG. 5, in accordance with which one of the chambers 112, 114 receives pressurized gas, e.g., air. The movable blade member 76 being attached to the piston body 80 reciprocates in slot 52 in directions 78 relative to the stationary blade member 74. Fitting 116, FIG. 3, is attached to plate 96 at threaded aperture 125, FIG. 5, and fitting 118 is attached to plate 98 at threaded aperture 127. Gas lines 38 and 36 are attached to respective fittings 116, 118 and to controller 34.

In FIG. 6, controller 34 includes a source 184 of pressurized gas connected to valve system 182. System 182 includes valves 183 operated by solenoid 185. System 182 selectively connects source 184 to one of gas lines 36" or 38". Line 36" is connected to lines 36, 36' and line 38" is connected to lines 38, 38'. System 182 also simultaneously selectively connects exhaust line 187 at ambient pressure to the other of gas line 36" or 38" so that one of lines 36", 38" serves as a pressure source and the other as an ambient return exhaust.

Solenoid 185 is coupled by lead 180 and lead 180' through switch S to power source 179. Switch control 178 selectively closes switch S by a coupling represented by broken line 189. Switch S may be a transistor (not shown) which closes a current path on lead 180' between source 179 and solenoid 185 in response to the reduction of current received by control 178 from sensor 172 on lead 176 or the reduction of current from a corresponding sensor (not shown) in device 12 on lead 176'. Diode 170 is powered by source 179 through switch control 178 via lead 174. Switch control 178 may include a bistable electronic device which, in response to a current from sensor 172 on lead 176 in the presence of light from device 170 (no component lead present), opens switch S, assuming it is a transistor, by reducing the current to the transistor control electrode and when the light path to sensor 172 is interrupted by component lead 22, closes switch S by increasing the transistor control electrode current to make the transistor conductive. Leads 176' and 174' couple the sensor and diode, respectively, of the other device 12 to switch control 178 to similarly operate switch S. Thus, a lead 22 or 24 inserted in devices 14, 12, respectively, interrupts the light paths to the corresponding sensors, closes switch S and operates solenoid 185. Solenoid 185, with no component leads present in devices 12, 14, assumes a stable position as shown in FIG. 6, coupling source 184 to line 38" and exhaust 187 to line 36". The solenoid assumes that stable position in response to the removing of power from source 179. A spring load on the solenoid actuator arm 191 may be used to place the solenoid in that stable state when power is removed by opening switch S. The valves 183 coupling to lines 36" and 38" is reversed from that shown when component leads are present in devices 12, 14.

In FIG. 3, when pressurized gas is supplied line 38, line 36 is coupled to the ambient for exhausting pressurized gas from chamber 114, FIG. 4, via exhaust 187, FIG. 6. Chamber 112, FIG. 4, is pressurized forcing piston body 80 to the right in the drawing. Subsequently, when chamber 114 receives pressurized gas on line 36, FIGS. 3 and 4, after the sensor 172 senses a lead in aperture 158, line 38 is simultaneously vented to the ambient for exhausting the pressurized gas in chamber 112. Pressurized gas is simultaneously on lines 36, 36' or 38, 38', as determined by the state of valves 183. The valves 183 and solenoid 185 are conventional.

In FIG. 3, when pressurized gas is switched from line 38 to line 36, the movable blade member 76 is moved in direction 124. Pressurized gas is also simultaneously switched from line 38' to line 36' to move the movable blade member 76' of device 12 in direction 124'. Thus, the movement of the blade members 76, 76' in respective parallel, opposite directions 124, 124' is simultaneous. Blade 76 operates on component lead 22 and blade member 76' operates on component lead 24.

Figure 2:
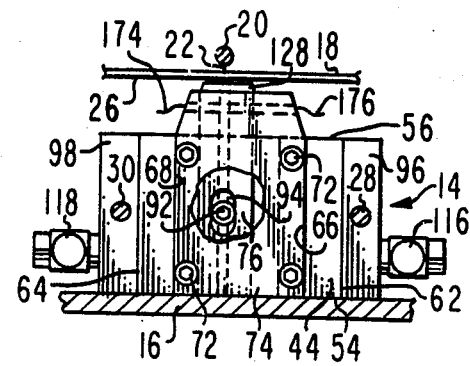
FIG. 2 is an elevation sectional view, partially fragmented, through the lead processing device of FIG. 1 taken along lines 2—2.

In operation, a printed circuit board 18 on a conveyor (not shown), FIGS. 1, 2, 4, is conveyed to an operating station and aligned so that the printed circuit board component aperture for lead 22 is aligned with the respective aperture 144, FIGS. 5 and 6, of the movable blade 76 and aperture 158 of the stationary blade 74. At the same time, the corresponding apertures of the device 12 are aligned with a second aperture on the printed circuit board 18 for receiving lead 24 of device 20. At this time, switch S is open and valves 183 are as shown in FIG. 6. A machine or operator inserts the leads 22, 24 of a component into the corresponding aligned printed circuit board 18 apertures. The leads pass through the slot 144 (and 144') of the moving blade members positioned as shown in FIG. 3 and into apertures 158 of the stationary blade members of devices 14 and 12.

Upon that occurrence, the lower portions 166, FIG. 6, of the lead 22 (and 24) within the aperture 158 (and 158') of the stationary blade 74 (and 74') simultaneously breaks the light path from the light emitting diode 170 (and 170') to the sensor 172 (and 172') of device 14 (and 12).

In FIGS. 3 and 6, immediately or after a suitable delay, for example, a delay of a fraction of a second, as may be desired, after the component leads 22, 24 are inserted, the switch control 178 in response to the interruption of light on sensor 172 (or 172') closes switch S via the coupling represented by broken line 189. This action supplies power to solenoid 185, switching the states of the valves 183, causing the valves 183 to simultaneously supply pressurized gas on lines 36 and 36' to the respective devices 14 and 12, FIG. 3. At the same time, the lines 38 and 38' are coupled by valves 183, FIG. 6, to exhaust 187 at ambient air pressure.

This selective applying of pressurized gas to one of each of the pistons, for example, piston 84, FIG. 5, at a corresponding end of device 14, FIG. 3, and the venting of the other piston chamber of each device such as piston 82, moves the movable blade members 76, 76' in the appropriate directions 124, 124' to cut and bend the leads 22, 24 of component 20.

In FIG. 6, after cutting, the lead portion 166 (and 166' of lead 24, not shown) drops out of the way by gravity and by the suction force of the vacuum in hole 160 and opens the light path between light emitting diode 170 (and 170') to sensor 172 (and 172'). This causes switch control 178 to open switch S, removing current from leads 180, 180' causing solenoid 185 (in a known way, e.g., by a spring) to operate the valves 183 to switch the pressurized gas from lines 36, 36' to lines 38 and 38', FIG. 3, and to switch the exhaust from lines 38, 38' to lines 36 and 36'. This returns the system to the initial start position. The movable blades thus return to the starting position shown in FIG. 3 in preparation for receipt of leads of a new component to be processed. Because movable blades 128 and 128', FIG. 3, and stationary blade members 74, 74' can be closely spaced, corresponding closely spaced leads can be readily processed by the system 10.

What is claimed is:

1. A component lead processing device comprising:
   a housing having a cavity;
   a piston body in said cavity for reciprocating in first and second directions in said cavity, said piston body including first and second aligned pistons each in sliding sealed engagement with the cavity walls at opposite respective piston body ends;
   a lead processing member attached to said piston body between said first and second pistons including means for receiving said lead and for processing said received lead when the member is moved; and
   control means responsive to the received lead for selectively applying pressurized gas to one and then the other of said pistons to move the piston body in each of two opposite directions and thereby move the lead processing member in said directions for processing said lead.

2. The device of claim 1 wherein said control means includes lead sense means coupled to said housing for sensing the presence of said received lead and means responsive to the sensed presence of said received lead including valve means for selectively coupling the source of said pressurized gas to one of said pistons.

3. The device of claim 2 wherein said member includes an arm attached to said body and a lead processing blade member attached to said arm for cutting and bending said lead as said piston body is moved in one of said directions.

4. The device of claim 3 wherein said housing includes a stationary blade member adjacent said lead processing blade member and having an aperture for receiving said component lead, said lead processing blade member being in sliding engagement with said stationary blade member at said aperture.

5. The device of claim 3 wherein said housing has an opening, said piston body has a slot facing said opening, said arm being located in said slot, and a stationary blade member over said arm and opening, said lead processing blade member being in reciprocal sliding engagement with said stationary blade member.

6. The device of claim 1 wherein said control means includes lead sense means for generating a signal manifesting the presence of a received lead to be processed and means responsive to said signal applied as an input thereto for moving said body in one of said two directions.

7. The device of claim 6 wherein said lead sense means includes light emitting means and light sense means responsive to the light from the light emitting means for causing said signal to be generated when the light from said light emitting means to said light sense means is interrupted by the presence of said lead, said housing having a lead receiving aperture located in the light path between said light emitting means and said light sense means so that the received lead interrupts said light path.

8. The device of claim 1 further including a pair of said devices and connecting means for connecting the lead processing members thereof in a predetermined facing spaced relation to process a plurality of leads in said spaced relation simultaneously.

9. A lead processing device for processing a lead of a component borne on a printed circuit board comprising:
   a housing having a cylindrical bore;
   a piston body in the bore having first and second oppositely facing pistons including piston sealing means for sealing said pistons in said housing;
   sealing means at each end of said bore to thereby form with said pistons first and second piston chambers in said housing;
   said housing having an opening intermediate said sealing means;
   a movable lead cutting and bending member attached to said body to said opening;
   a stationary member attached to said housing at said opening and adjacent said cutting and bending member, said stationary member including an aperture for receiving said lead;
   lead sense means adjacent said aperture for sensing the presence of said received lead in said aperture; and
   control means responsive to said lead sense means for operating said piston body in response to said sensed received lead.

10. The device of claim 9 wherein said lead sense means includes a light emitting device and means responsive to the light emitted by said emitting device adjacent said aperture having an output signal at a first value manifesting the presence of said received lead and at a second value manifesting the completion of the processing of said received lead, said control means including means responsive to said output signal applied as an input thereto for sequentially supplying pressurized gas to said first and then said second piston chambers.

11. The device of claim 9 wherein said stationary member has a first aperture for receiving said lead, and a second aperture transverse to and in communication with the first aperture for receiving said lead sense means.

12. A lead processing device for processing a lead of a component borne on a printed circuit board comprising:
   a housing having a cylindrical bore;

a piston body in the bore having first and second oppositely facing pistons including piston sealing means for sealing said pistons in said housing;

sealing means at each end of said bore to thereby form with said pistons first and second piston chambers in said housing;

said housing having an opening intermediate said sealing means;

a movable lead cutting and bending member attached to said body at said opening; and a stationary member attached to and exterior said housing at said opening and adjacent said cutting and bending member, said stationary member including an aperture for receiving said lead.

* * * * *